(12) United States Patent
Lin et al.

(10) Patent No.: US 10,483,132 B2
(45) Date of Patent: Nov. 19, 2019

(54) POST-PASSIVATION INTERCONNECT STRUCTURE AND METHOD OF FORMING THE SAME

(71) Applicant: Taiwan Semiconductor Manufacturing Company, Ltd., Hsin-Chu (TW)

(72) Inventors: Hung-Jen Lin, Tainan (TW); Tsung-Ding Wang, Tainan (TW); Chien-Hsun Lee, Chu-tung Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/905,997

(22) Filed: May 30, 2013

(65) Prior Publication Data
US 2014/0183725 A1   Jul. 3, 2014

Related U.S. Application Data

(60) Provisional application No. 61/747,136, filed on Dec. 28, 2012.

(51) Int. Cl.
*H01L 23/498* (2006.01)
*H01L 21/56* (2006.01)
(Continued)

(52) U.S. Cl.
CPC ........ *H01L 21/566* (2013.01); *H01L 23/3114* (2013.01); *H01L 23/3171* (2013.01); *H01L 23/3192* (2013.01); *H01L 24/03* (2013.01); *H01L 24/05* (2013.01); *H01L 24/13* (2013.01); *H01L 23/525* (2013.01); *H01L 23/564* (2013.01); *H01L 24/11* (2013.01); *H01L 2224/0235* (2013.01); *H01L 2224/02375* (2013.01); *H01L 2224/0345* (2013.01); *H01L 2224/0346* (2013.01); *H01L 2224/0347* (2013.01); *H01L 2224/03452* (2013.01); *H01L 2224/0401* (2013.01); *H01L 2224/05022* (2013.01); *H01L 2224/05027* (2013.01); *H01L 2224/05124* (2013.01); *H01L 2224/05147* (2013.01); *H01L 2224/05166* (2013.01); *H01L 2224/05181* (2013.01); *H01L 2224/05186* (2013.01); *H01L 2224/05548* (2013.01); *H01L 2224/05552* (2013.01); *H01L 2224/05567* (2013.01);
(Continued)

(58) Field of Classification Search
CPC .......................... H01L 23/522; H01L 21/768
USPC .................................................. 257/737, 738
See application file for complete search history.

(56) References Cited

U.S. PATENT DOCUMENTS 5,994,783 A * 11/1999 You ..................... H01L 23/3107
257/712
6,617,655 B1 * 9/2003 Estacio ................... H01L 23/50
257/401
(Continued)

*Primary Examiner* — Cuong Q Nguyen
*Assistant Examiner* — Peter M Albrecht
(74) *Attorney, Agent, or Firm* — Slater Matsil, LLP

(57) ABSTRACT

A semiconductor device includes a passivation layer formed on a semiconductor substrate, a protective layer overlying the passivation layer and having an opening, an interconnect structure formed in the opening of the protective layer, a bump formed on the interconnect structure, and a molding compound layer overlying the interconnect structure and being in physical contact with a lower portion of the bump.

22 Claims, 5 Drawing Sheets

(51) Int. Cl.
*H01L 23/31* (2006.01)
*H01L 23/00* (2006.01)
*H01L 23/525* (2006.01)

(52) U.S. Cl.
CPC ............... *H01L 2224/05624* (2013.01); *H01L 2224/05647* (2013.01); *H01L 2224/1191* (2013.01); *H01L 2224/131* (2013.01); *H01L 2224/13005* (2013.01); *H01L 2224/13022* (2013.01); *H01L 2224/13024* (2013.01); *H01L 2224/13111* (2013.01); *H01L 2224/13144* (2013.01); *H01L 2224/13147* (2013.01); *H01L 2224/13155* (2013.01); *H01L 2924/181* (2013.01)

(56) References Cited

U.S. PATENT DOCUMENTS

| | | | | |
|---|---|---|---|---|
| 6,731,004 B2* | 5/2004 | Saitoh | ............... | H01L 21/486 257/635 |
| 6,762,115 B2* | 7/2004 | Lin | ............... | H01L 21/768 257/E21.004 |
| 7,057,282 B2* | 6/2006 | Hanaoka | ............... | H01L 23/3114 257/737 |
| 7,847,411 B2* | 12/2010 | Takaike | ............... | H01L 23/49827 257/686 |
| 8,058,726 B1* | 11/2011 | Jin | ............... | H01L 23/3192 257/678 |
| 8,455,768 B2* | 6/2013 | Booth, Jr. | ............... | H01L 21/31116 174/250 |
| 9,142,510 B2* | 9/2015 | Lee | ............... | H01L 24/03 |
| 2002/0008320 A1* | 1/2002 | Kuwabara | ............... | H01L 21/56 257/738 |
| 2003/0025173 A1* | 2/2003 | Suminoe | ............... | H01L 23/3114 257/459 |
| 2006/0038291 A1* | 2/2006 | Chung | ............... | H01L 23/3128 257/738 |
| 2007/0020815 A1 | 1/2007 | Chaware et al. | | |
| 2009/0115058 A1* | 5/2009 | Yu et al. | ............... | 257/738 |
| 2009/0283877 A1* | 11/2009 | Tsai et al. | ............... | 257/659 |
| 2010/0117236 A1* | 5/2010 | Lin et al. | ............... | 257/753 |
| 2011/0101520 A1* | 5/2011 | Liu et al. | ............... | 257/737 |
| 2011/0101532 A1* | 5/2011 | Pohl | ............... | H01L 21/486 257/758 |
| 2012/0104625 A1* | 5/2012 | Park | ............... | H01L 24/19 257/774 |
| 2012/0306070 A1* | 12/2012 | Yew | ............... | H01L 24/82 257/737 |

* cited by examiner

US 10,483,132 B2

POST-PASSIVATION INTERCONNECT STRUCTURE AND METHOD OF FORMING THE SAME

This application claims priority to U.S. Provisional Application Ser. No. 61/747,136, filed on Dec. 28, 2012, entitled "Post-Passivation Interconnect Structure and Method of Forming the Same," which application is hereby incorporated herein by reference.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another device. Bond pads can be used for wire bonding or flip-chip bonding. Flip-chip packaging utilizes bumps to establish electrical contact between a chip's input/output (I/O) pads and a substrate or lead frame of a package. Structurally, a bump actually contains the bump itself and an "under bump metallurgy" (UBM) located between the bump and the I/O pad. Wafer level chip scale packaging (WLCSP) is currently widely used because WLCSP is low cost and has relatively simple processes. In a typical WLCSP, post-passivation interconnect (PPI) lines such as redistribution lines (RDLs) are formed on passivation layers, followed by the formation of polymer films and bumps. A ball placement or a ball drop process is utilized in the WLCSP technology, but the ball drop performance is still a concern.

DETAILED DESCRIPTION

Figure 1:
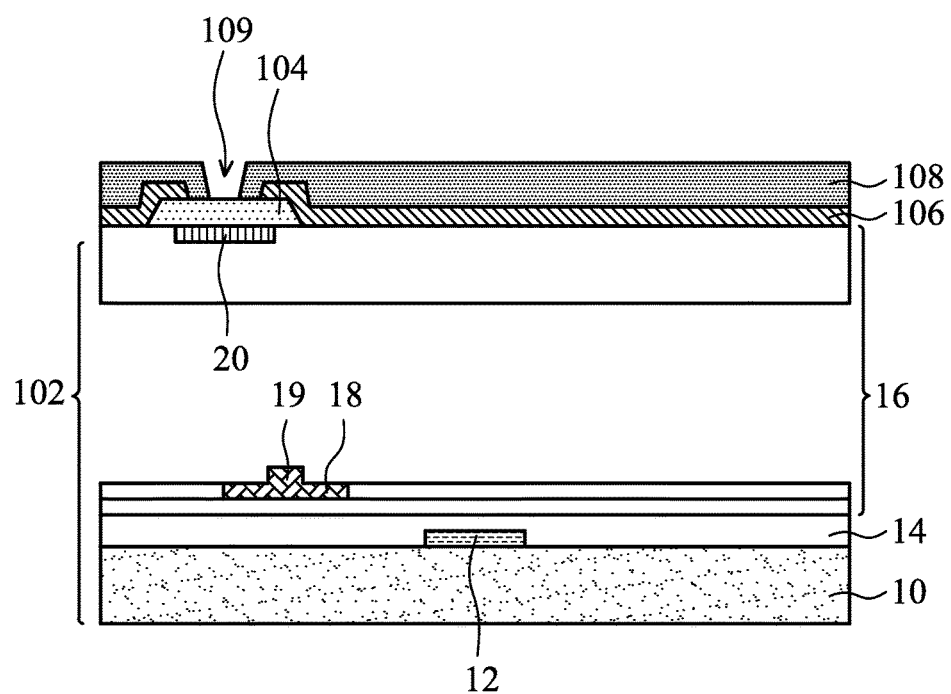
FIGS. 1-6 are cross-sectional views of a semiconductor device at various intermediate stages of a method of forming PPI structures on a semiconductor substrate in accordance with exemplary embodiments.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Embodiments described herein relate to the use of bump structures for use with semiconductor devices. As will be discussed below, embodiments are disclosed that utilize a bump structure for the purpose of attaching one substrate to another substrate, wherein each substrate may be a device, wafer, interposer substrate, printed circuit board, packaging substrate, or the like, thereby allowing for device-to-device, wafer-to-device, wafer-to-wafer, device or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-6 are cross-sectional views of a semiconductor device at various intermediate stages of a method of forming PPI structures on a semiconductor substrate in accordance with exemplary embodiments.

Referring first to FIG. 1, a semiconductor substrate 102 includes a substrate 10, an electrical circuitry 12, an interlayer dielectric (ILD) layer 14, inter-metal dielectric (IMD) layers 16 and the associated metallization layers 18, 19 and 20.

A portion of the substrate 10 having electrical circuitry 12 formed thereon is shown, in accordance with some embodiments. The substrate 10 may comprise, for example, bulk silicon, doped or undoped, or an active layer of a semiconductor-on-insulator (SOI) substrate. The substrate 10 may be provided as a wafer level scale or a chip level scale. Other substrates, such as a multi-layered or gradient substrate may also be used.

Electrical circuitry 12 formed on the substrate 10 may be any type of circuitry suitable for a particular application. In some embodiments, the electrical circuitry 12 includes electrical devices formed on the substrate 10 having one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The ILD layer 14 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the ILD layer 14 may comprise a plurality of dielectric layers. Contacts (not shown) may be formed through the ILD layer 14 to provide an electrical connection to the electrical circuitry 12.

One or more inter-metal dielectric (IMD) layers 16 and the associated metallization layers are formed over the ILD layer 14. Generally, the one or more IMD layers 16 and the associated metallization layers (such as metal lines 18 and vias 19) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. In some embodiments, one or more etch stop layers (not shown) may be positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In some embodiments, etch stop layers may be formed of SiN, SiCN, SiCO, CN, combinations thereof, or the like, deposited by CVD or PECVD techniques.

In some embodiments, the metallization layers, including metal lines 18 and vias 19, may be formed of copper or copper alloys, or of other metals. Further, the metallization layers include a top metal layer 20 formed and patterned in or on an uppermost IMD layer to provide external electrical connections and to protect the underlying layers from various environmental contaminants. In some embodiments, the uppermost IMD layer is formed of a dielectric material, such as silicon nitride, silicon oxide, undoped silicon glass, and the like. In subsequent drawings, semiconductor substrate 10, electrical circuitry 12, ILD layer 14, and metallization layers 18 and 19 are not illustrated. In some embodiments, the top metal layer 20 is formed as a part of the top metallization layer on the uppermost IMD layer.

Thereafter, a contact pad 104 is formed and patterned to contact the top metal layer 20, or alternatively, electrically coupled to top metal layer 20 through a via. In some embodiments, the contact pad 104 may be formed of aluminum, aluminum copper, aluminum alloys, copper, copper alloys, or the like. One or more passivation layers, such as a passivation layer 106 are formed and patterned over the contact pad 104. In some embodiments, the passivation layer 106 may be formed of a dielectric material, such as undoped silicate glass (USG), silicon nitride, silicon oxide, silicon oxynitride or a non-porous material by any suitable method, such as CVD, PVD, or the like. The passivation layer 106 is formed to cover a peripheral portion of the contact pad 104, and to expose a central portion of the contact pad 104 through an opening in passivation layer 106. The passivation layer 106 may be a single layer or a laminated layer. In FIG. 1, a single layer of the contact pad 104 and the passivation layer 106 are shown for illustrative purposes only. As such, other embodiments may include any number of conductive layers and/or passivation layers.

Next, a first protective layer 108 is formed and patterned over the passivation layer 106. In some embodiments, the first protective layer 108 may be, for example, a polymer layer, which is patterned to form an opening 109, through which the contact pad 104 is exposed. In some embodiments, the polymer layer is formed of a polymer material such as an epoxy, polyimide, benzocyclobutene (BCB), polybenzoxazole (PBO), and the like, although other relatively soft, often organic, dielectric materials can also be used. The formation methods include spin coating or other methods. The first protective layer 108 has a thickness in a range between about 1 μm and about 10 μm. For example, a thickness between about 5 μm and about 8 μm.

Figure 2:
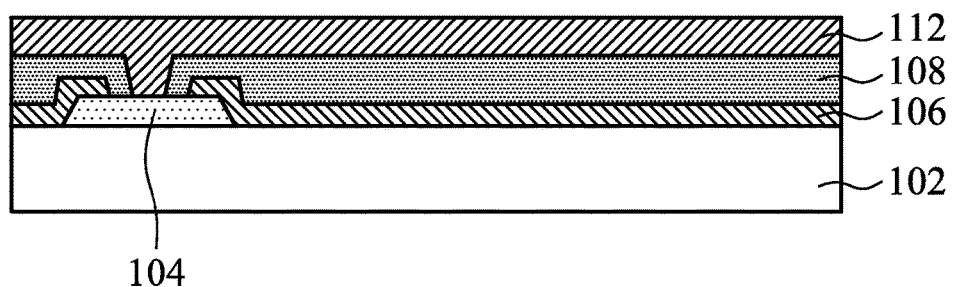
Figure 3:
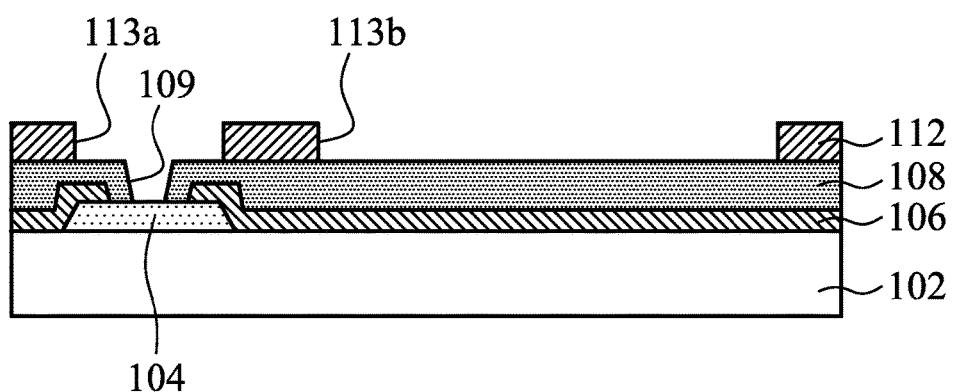

Referring to FIG. 2, a second protective layer 112 is formed on the first protective layer 108 and fills the opening 109. Using photolithography and/or etching processes, the second protective layer 112 is patterned to form openings 113a and 113b exposing portions of the first protective layer 112 as depicted in FIG. 3. In some embodiments, the opening 113a is formed in the second protective layer 112 over the contact pad 104 to expose the opening 109 of the first protective layer 108, and a portion of the first protective layer 108 adjacent to the opening 109 is also exposed by the opening 113a. That is, the opening 113a is positioned over the opening 109, and the opening 113a has a diameter greater that that of the opening 109. The opening 113a is a window on which one end of PPI structure will be fabricated in subsequent processes. In some embodiments, the opening 113b is formed in the second protective layer 112 to expose other portions of the first protective layer 108. The opening 113b is a window on which a landing pad region of PPI structure will be fabricated in subsequent process.

Figure 4:
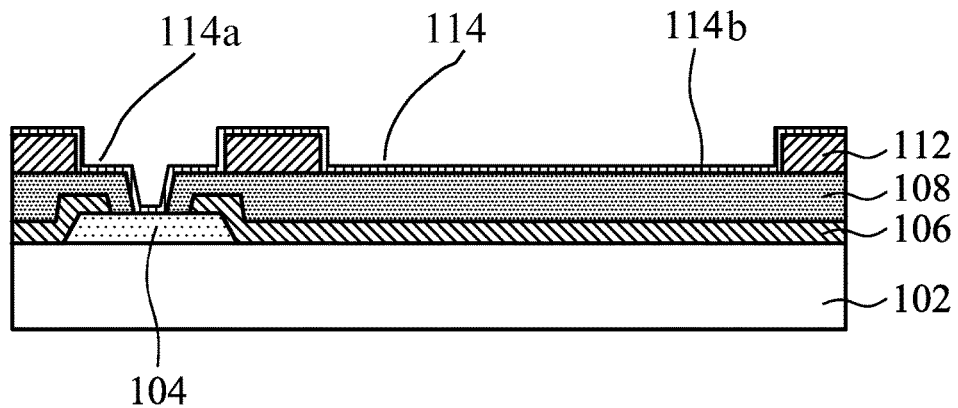

Next, as shown in FIG. 4, a first metallization layer 114 is formed on the resultant structure to cover the exposed portions of the contact pad 104, the first protective layer 108 and the second protective layer 112. The metallization layer 114 is formed so as to electrically connect to the contact pad 104. In some embodiments, the first metallization layer 114 includes at least one layer comprising titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the first metallization layer 114 includes at least one Ti-containing layer and at least one Cu-containing layer. In an embodiment, the first metallization 114 includes a first portion 114a and a second portion 114b on which the PPI structure will be formed. The first portion 114a is formed forms along the sidewalls and bottom of the openings 109 and 113a, while the second portion 114b is formed along the sidewalls and bottom of the opening 113b.

Figure 5:
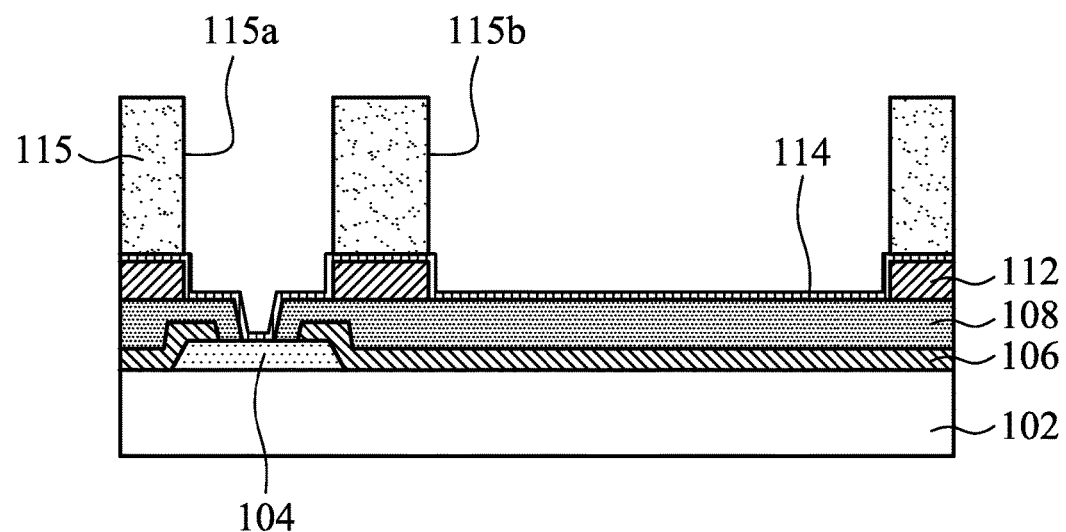

Referring to FIG. 5, a photoresist layer 115 is provided on the metallization layer 114. Using photolithography process, the photoresist layer 115 is patterned to form openings 115a and 155b. In an embodiment, the opening 115a exposes the first portion 114a of the first metallization layer 114, while the opening 115b exposes the second portion 114b of the first metallization layer 114. In an embodiment, the patterned photoresist layer 115 stands over the patterned second protective layer 112. The position and diameter of the openings 115a and 115b are substantially the same as the openings 113a and 113b respectively.

Figure 6:
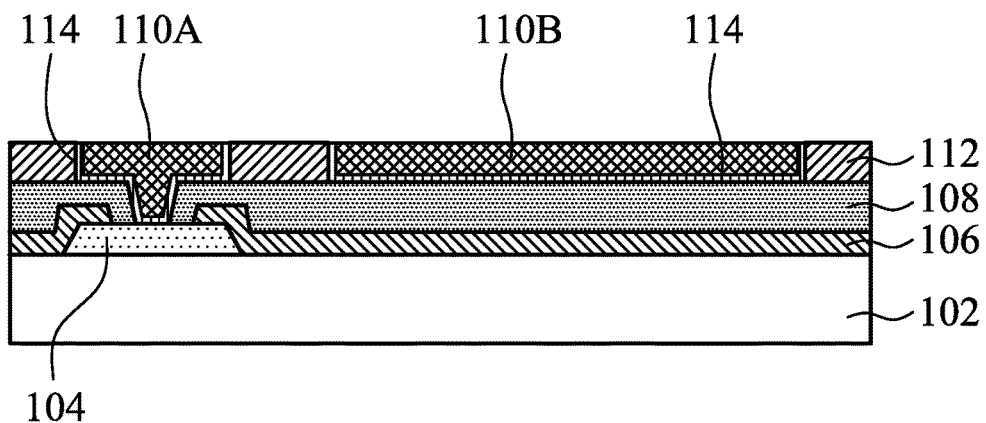

Then as shown in FIG. 6, a second metallization layer 110 is formed in the openings 115a and 115b. In an embodiment, the second metallization layer 110 fills the openings 109, 113a and 113b. After removing the photoresist layer 115, exposed portions of the first metallization layer 114 on the surface of the second protective layer 112 are removed. This completes the formation of the second metallization layer 110 within the second protective layer 112. The second metallization layer 110 has a surface substantially planar with the surface of the second protective layer 112. In at least an embodiment, the second metallization layer 110 is a post-passivation interconnect (PPI) layer 110, which may also functions as power lines, re-distribution lines (RDL), inductors, capacitors or any passive components. In some embodiments, the PPI structure 110 includes copper, aluminum, copper alloy, or other mobile conductive materials using plating, electroless plating, sputtering, chemical vapor deposition methods, and the like. In some embodiments, the PPI structure 110 includes a copper layer or a copper alloy layer.

Figure 7:
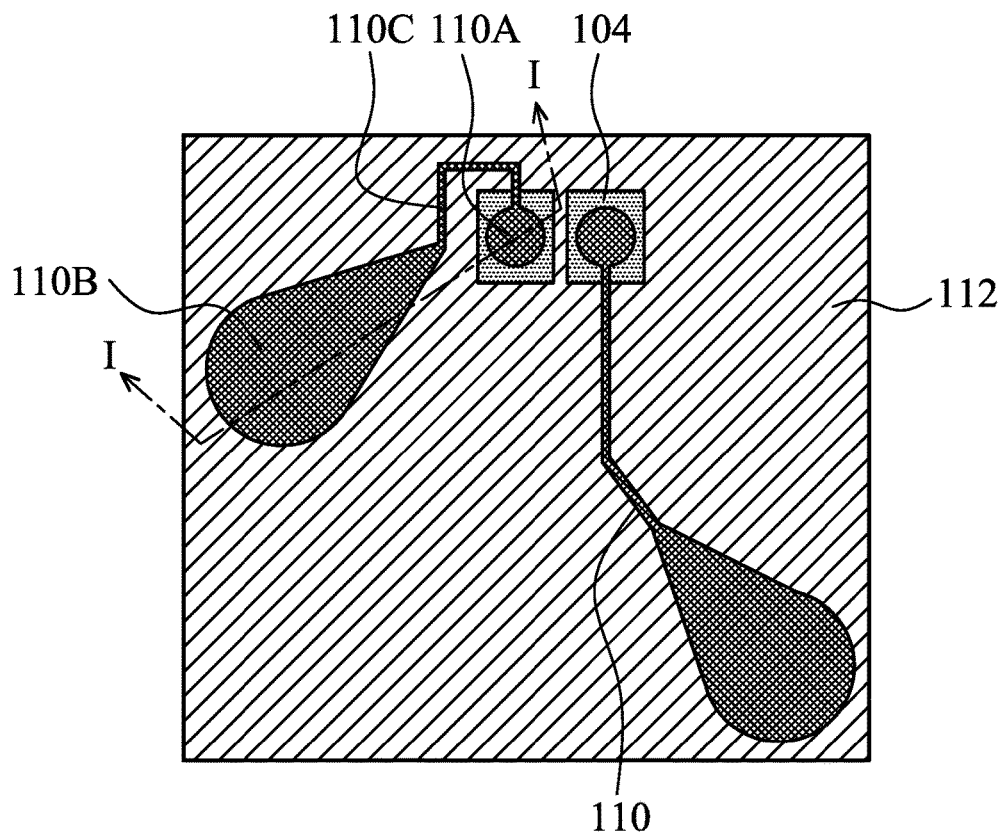
FIG. 7 is a plane view of the PPI structures in accordance with an exemplary embodiment.

FIG. 7 is a plane view of the PPI structures 110 in accordance with an exemplary embodiment, and FIG. 6 is a cross-section view of the PPI structure 110 along line I-I of FIG. 7. The PPI structures 110 are formed in the second protective layer 112. Each illustrated PPI structure 110 includes a first region 110A, a second region 110B and a third region 110C. The first region 110A is one end of the PPI structure 110 formed over and electrically connected to the contact pad 104. The second region 110B is the other end of the PPI structure 110, functioning as a landing pad region on which a bump feature will be formed in subsequent processes. The third region 110C is a line region positioned between and electrically connecting the first region 110A and the second region 110B. It is experimentally observed in failure modes of pressure cooker test (PCT) and thermal cycle (TC) tests that the PPI structures 110 separated by the second protective layer 112 can prevent moisture attacking and reduce crack damage caused by liquid molding compound.

Figure 8:
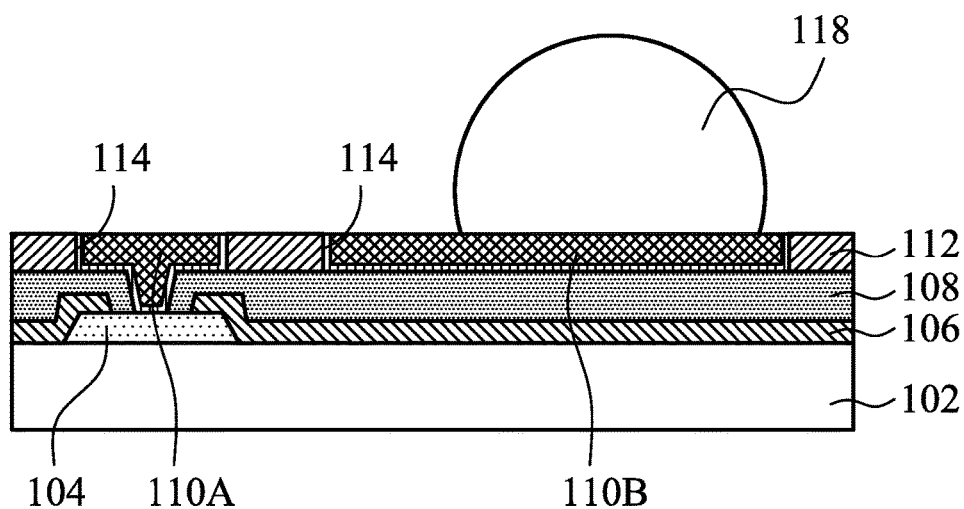
FIGS. 8-9 are cross-sectional views of a semiconductor device at various intermediate stages of a method of forming a bump on the PPI structure in accordance with exemplary embodiments.
Figure 9:
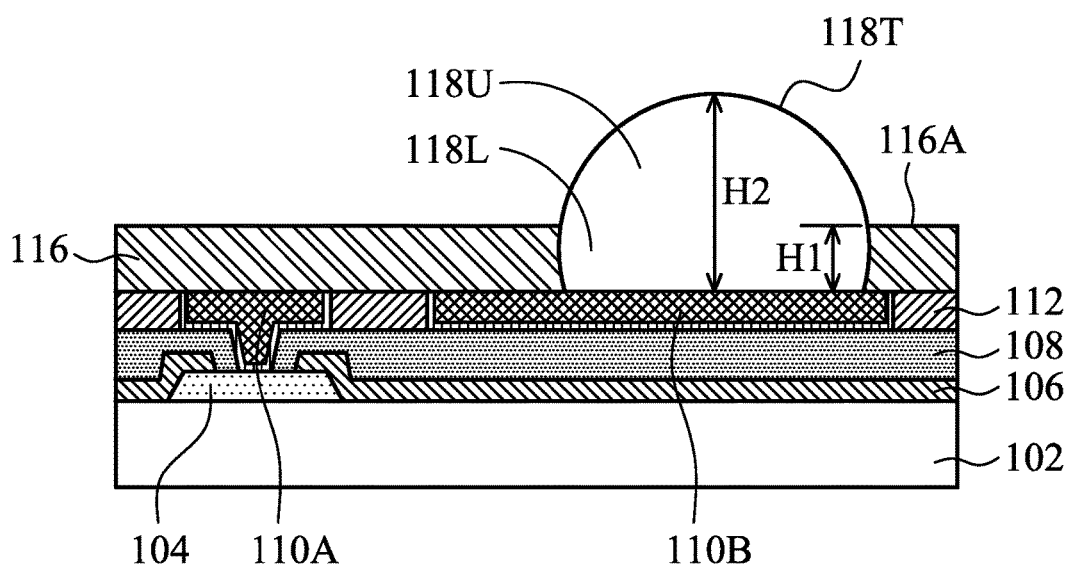

FIGS. 8-9 are cross-sectional views of a semiconductor device at various intermediate stages of a method of forming a bump on the PPI structure in accordance with exemplary embodiments.

Referring to FIG. 8, a bump 118 is formed on the second region 110B of the PPI structure 110. In an embodiment, the bump 118 is in physical contact with the PPI structure 110. The bump 118 can be a solder bump, a Cu bump or a metal bump including Ni or Au. In some embodiments, the bump 118 is a solder bump formed by attaching a solder ball to the second region 110B of the PPI structure 110 and then thermally reflowing the solder material. In an embodiment, the solder bump has a diameter greater than about 200 μm. In some embodiments, the solder bump includes a lead-free pre-solder layer, SnAg, or a solder material including alloys of tin, lead, silver, copper, nickel, bismuth, or combinations thereof. In some embodiments, the solder bump is formed by plating a solder layer using photolithography technologies followed by reflow processes.

Next, as shown in FIG. 9, a molding compound layer 116 is applied on the second protective layer 112, where the bump 118 is partially buried in the molding compound layer 116. In some embodiments, the molding compound layer 116 is in physical contact with a lower portion 118L of the bump 118, while an upper portion 118U of the bump 118 is exposed and protrudes from a top surface 116A of the molding compound layer 116. In some embodiments, a top portion 118T of the bump 118 is higher than the top surface 116A of the molding compound layer 116. The molding compound layer 116 may be in physical contact with the second protective layer 112 and/or the PPI structure 110. In some embodiments, a height (H1) of the bump 118 that is buried in the molding compound layer 116 may be between about ¼ to ¾ of a total height H2 of the bump 118. In at least one embodiment, the molding compound layer 116 is formed by applying a liquid molding compound and performing a curing process to cure and solidify the liquid molding compound. In some embodiments, a release film or a soft material may be applied on the liquid molding compound. Pressure is applied on the release film on the liquid molding compound, so that a portion of the bump 118 is pressed into release film. Furthermore, the pressure applied on the release film may push some of liquid molding compound downward. While the pressure is applied to the release film pushing against the bump and the liquid molding compound, a curing may be performed to cure and solidify liquid molding compound. After the solidification, the top portion 118T of the bump 118 is lower than the top surface 116A of molding compound layer 116. Thereafter, the release film is peeled off the molding compound layer 116, which is now in a solid form. The molding compound layer 116 residue remaining on the top portion 118T of the bump 118 is then etched. In the resulting structure, the molding compound layer 116 is formed with a portion of the bump 118 buried therein. After the bump formation, for example, an encapsulant may be formed, a singulation process may be performed to singulate individual devices 100 and wafer-level or device-level stacking or the like may be performed. Embodiments may be used in many different situations. For example, embodiments may be used in a device-to-device bonding configuration, a device-to-wafer bonding configuration, a wafer-to-wafer bonding configuration, device-level packaging, wafer-level packaging, or the like. In some embodiments, the semiconductor device 100 shown in FIG. 9 is flipped upside down and attached to another substrate, forming a package assembly.

The present embodiments provide PPI structures 110 formed in the protective layer 112, on which the bump 118 is formed and partially surrounded by the molding compound layer 116. The PPI structure 110 can prevent moisture attacking and reduce crack damage caused by molding compound layer 116. The molding compound layer 116 around the lower portion of the bump 118 can further enhance the thermal cycling life of the package assembly. Compared with other approaches of forming PPI structures within the molding compound layer, the present embodiments provide a method of forming the PPI structures 110 in the second protective layer 112 can achieve a low-cost structure without extra mask.

In accordance with an embodiment, a semiconductor device includes a passivation layer formed on a semiconductor substrate, a protective layer overlying the passivation layer and having an opening, an interconnect structure formed in the opening of the protective layer, a bump formed on the interconnect structure, and a molding compound layer overlying the interconnect structure and being in physical contact with a lower portion of the bump.

In accordance with another embodiment, a semiconductor device includes a contact pad on a semiconductor substrate, a polymer layer overlying the contact pad and the semiconductor substrate, a post-passivation interconnect (PPI) structure surrounded by the polymer layer, wherein the PPI structure comprises a first portion and a second portion, the first portion being electrically connected to the contact pad, a bump formed on and electrically connected to the second portion of the PPI structure, and a molding compound layer overlying the PPI structure and the polymer layer and being in physical contact with a lower portion of the bump.

In according with one aspect of the exemplary embodiment, a method of forming a semiconductor device, including: forming a passivation layer on a semiconductor substrate; forming a polymer layer overlying the passivation layer; forming an opening in the polymer layer; forming an interconnect structure in the opening of the polymer layer; forming a bump formed on the interconnect structure; and forming a molding compound layer surrounding the bump.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor device, comprising:
a passivation layer formed on a semiconductor substrate, the passivation layer having a first opening exposing a contact pad, the passivation layer extending along sidewalls of the contact pad;
a protective layer overlying the passivation layer, the protective layer comprising a first protective layer and a second protective layer, the first protective layer being a single layer and having a second opening, the first protective layer extending along an upper surface and sidewalls of the passivation layer, the first protective layer contacting the contact pad;
an interconnect structure formed in and filling the second opening of the first protective layer and the first opening in the passivation layer, the interconnect structure having an entire top surface substantially co-planar with a top surface of the second protective layer, wherein the interconnect structure comprises a first interconnect layer extending continuously from the top surface of the second protective layer to a bottommost surface of the interconnect structure, wherein a sidewall of the second protective layer adjacent to the interconnect structure is substantially perpendicular to the top surface of the second protective layer;
a bump directly on the interconnect structure, wherein the interconnect structure is in physical contact with a top surface of the first protective layer directly below the bump; and
a molding compound layer in physical contact with the protective layer, the interconnect structure and a lower portion of the bump.

2. The semiconductor device of claim 1, wherein an upper portion of the bump protrudes from a top surface of the molding compound layer.

3. The semiconductor device of claim 1, wherein the contact pad is partially covered by the passivation layer, and wherein the interconnect structure comprises a first sidewall and a second sidewall having different slopes.

4. The semiconductor device of claim 1, wherein the first protective layer comprises a polymer layer.

5. The semiconductor device of claim 1, wherein the interconnect structure is a metallization layer comprising copper, and the protective layer comprises a polymer layer.

6. A semiconductor device, comprising:
a contact pad on a semiconductor substrate;
a passivation layer covering at least a portion of the contact pad;
a first polymer layer overlying the contact pad and the semiconductor substrate, a second polymer layer overlying the first polymer layer, the first polymer layer and the second polymer layer including an opening exposing the contact pad;
a post-passivation interconnect (PPI) structure formed in and filling the opening of the first polymer layer and the second polymer layer and having an entire top surface substantially co-planar with an uppermost surface of the second polymer layer, wherein the PPI structure comprises a first portion and a second portion, the first portion being electrically connected to the contact pad, the contact pad being interposed between the PPI structure and the semiconductor substrate, and wherein the PPI structure comprises a barrier layer extending along sidewalls of the first polymer layer and sidewalls of the second polymer layer, the barrier layer comprising a single continuous layer extending from the uppermost surface of the second polymer layer and directly contacting the contact pad;
a bump on and electrically connected to the second portion of the PPI structure, the bump and the PPI structure having no intervening contact pad, wherein the second portion of the PPI structure is in physical contact with an upper surface of the first polymer layer directly below the bump; and
a molding compound layer in physical contact with the PPI structure and the second polymer layer, the molding compound layer being in physical contact with a lower portion of the bump, wherein the bump does not extend over an upper surface of the molding compound layer.

7. The semiconductor device of claim 6, wherein an upper portion of the bump protrudes from the upper surface of the molding compound layer.

8. The semiconductor device of claim 6, wherein the bump is a solder bump in physical contact with the second portion of the PPI structure.

9. A semiconductor device, comprising:
a contact pad on a wafer scale substrate;
a first protective layer overlying the contact pad, the first protective layer having a first opening exposing the contact pad, the first protective layer contacting the contact pad;
a first polymer layer overlying the first protective layer and the wafer scale substrate, and a second polymer layer overlying the first polymer layer, the first polymer layer and the second polymer layer including a second opening exposing the contact pad, the first polymer layer being in physical contact with the contact pad, the first polymer layer and the first protective layer being formed of different materials;
a post-passivation interconnect (PPI) structure formed in and filling the first opening of the first protective layer and the second opening of the first polymer layer and the second polymer layer, the PPI structure having an entire top surface substantially co-planar with a topmost surface of the second polymer layer, wherein the PPI structure comprises a first portion, a second portion, and a third portion, the first portion being electrically connected to the contact pad, the first portion extending into the first opening, wherein the third portion electrically couples the first portion to the second portion, a width of the third portion being less than a width of the first portion and a width of the second portion in a plan view, the contact pad being interposed between the PPI structure and the wafer scale substrate;

a barrier layer extending along sidewalls of the PPI structure, wherein the barrier layer comprises a single barrier layer, wherein the single barrier layer extends continuously from the topmost surface of the second polymer layer to the contact pad, wherein the single barrier layer does not extend between the first portion and the second portion of the PPI structure, and wherein the single barrier layer comprises a different material than the PPI structure;

a bump directly on and electrically connected to the second portion of the PPI structure; and a molding compound layer in physical contact with the PPI structure and the second polymer layer, the molding compound layer contacting the bump.

10. The semiconductor device of claim 9, wherein an upper portion of the bump protrudes from a top surface of the molding compound layer.

11. The semiconductor device of claim 9, wherein the bump is a solder bump in physical contact with the second portion of the PPI structure.

12. The semiconductor device of claim 1, wherein the first protective layer has a same material composition extending from the top surface of the first protective layer to the upper surface of the passivation layer.

13. The semiconductor device of claim 9, wherein a thickness of the first polymer layer is from about 5 μm to about 8 μm.

14. The semiconductor device of claim 1, wherein the interconnect structure comprises a first metallization layer and a second metallization layer, the first metallization layer being interposed between the second metallization layer and the contact pad.

15. The semiconductor device of claim 1, wherein a sidewall of the first protective layer adjacent to the interconnect structure is tapered.

16. The semiconductor device of claim 1, wherein the passivation layer and the first protective layer are formed of different materials.

17. The semiconductor device of claim 6, wherein the barrier layer separates the PPI structure from the contact pad.

18. The semiconductor device of claim 6, wherein the barrier layer extends over an upper surface of the first polymer layer.

19. The semiconductor device of claim 6, wherein the barrier layer is formed of a different material than the PPI structure.

20. The semiconductor device of claim 9, wherein a height of the molding compound layer is between about 0.25 and about 0.75 of a height of the bump.

21. The semiconductor device of claim 1, wherein the interconnect structure comprises:

a first portion directly over the contact pad, the first portion having an upper surface level with the top surface of the second protective layer;

a second portion directly under the bump, the second portion having an upper surface level with the top surface of the second protective layer, the second portion having a lower surface over the top surface of the first protective layer; and a third portion electrically interposed between the first portion and the second portion, the third portion having an upper surface level with the top surface of the second protective layer, a width of the third portion being less than a width of the first portion and a width of the second portion.

22. The semiconductor device of claim 6, wherein the PPI structure further comprises a third portion connected to the first portion on one end and the second portion on an opposing end, an upper surface of the first portion, an upper surface of the second portion, and an upper surface of the third portion being level with the uppermost surface of the second polymer layer, the third portion extending in a direction other than co-linear with a line between the first portion and the second portion.

* * * * *